United States Patent
Zhao et al.

(10) Patent No.: US 11,237,436 B2
(45) Date of Patent: Feb. 1, 2022

(54) SPACER, METHOD OF MANUFACTURING THE SAME, DISPLAY PANEL AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Biyu Zhao, Beijing (CN); Kwanggyun Jang, Beijing (CN); Chang Zhang, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 736 days.

(21) Appl. No.: 16/070,059

(22) PCT Filed: Dec. 11, 2017

(86) PCT No.: PCT/CN2017/115439
§ 371 (c)(1),
(2) Date: Jul. 13, 2018

(87) PCT Pub. No.: WO2018/218925
PCT Pub. Date: Dec. 6, 2018

(65) Prior Publication Data
US 2021/0215963 A1     Jul. 15, 2021

(30) Foreign Application Priority Data
May 27, 2017   (CN) .......................... 201710395936.2

(51) Int. Cl.
G02F 1/1339   (2006.01)
G02F 1/1333   (2006.01)
(Continued)

(52) U.S. Cl.
CPC ...... *G02F 1/13398* (2021.01); *G02F 1/13338* (2013.01); *G02F 1/13396* (2021.01);
(Continued)

(58) Field of Classification Search
CPC ............ G02F 1/13398; G02F 1/13396; G02F 1/133305; G02F 1/13338; G02F 1/13394; G06F 3/044; G06F 3/0443; H01L 27/323
See application file for complete search history.

(56) References Cited

U.S. PATENT DOCUMENTS 8,878,803 B2   11/2014   Kimura et al.
9,214,507 B2   12/2015   Mathew et al.
(Continued)

FOREIGN PATENT DOCUMENTS

CN   200988327 Y   12/2007
CN   101963717 A   2/2011
(Continued)

OTHER PUBLICATIONS

English language translation of Chinese Patent Application No. 103439836; downloaded from the European Patent Office at https://worldwide.espacenet.com on Apr. 23, 2021. Translation provided by Google tool available onsite. (Year: 2013).*
(Continued)

*Primary Examiner* — Angela K Davison
(74) *Attorney, Agent, or Firm* — Kinney & Lange, P.A.

(57) ABSTRACT

A spacer includes a first layer, a second layer and a third layer which are disposed in a stacked manner, the second layer includes an upper portion and a lower portion, the lower portion is embedded in the first layer, at least a part of
(Continued)

the upper portion is embedded in the third layer, and a hardness of a material of the second layer is higher than a hardness of a material of each of the first layer and the third layer.

17 Claims, 5 Drawing Sheets

(51) Int. Cl.
*H01L 27/32* (2006.01)
*H01L 51/56* (2006.01)

(52) U.S. Cl.
CPC ...... *G02F 1/133305* (2013.01); *H01L 27/323* (2013.01); *H01L 51/56* (2013.01)

(56) References Cited

U.S. PATENT DOCUMENTS

| | | | |
|---|---|---|---|
| 9,515,131 | B2 | 12/2016 | Mathew et al. |
| 9,780,159 | B2 | 10/2017 | Mathew et al. |
| 2013/0050126 | A1 | 2/2013 | Kimura et al. |
| 2014/0049522 | A1 | 2/2014 | Mathew et al. |
| 2015/0102292 | A1 | 4/2015 | Kim |
| 2016/0004110 | A1* | 1/2016 | Imai ............. G02F 1/1341 349/42 |
| 2016/0033803 | A1 | 2/2016 | Zhang |
| 2016/0079337 | A1 | 3/2016 | Mathew et al. |
| 2017/0062547 | A1 | 3/2017 | Mathew et al. |
| 2017/0139513 | A1* | 5/2017 | Hong ............. G02B 26/005 |
| 2018/0130970 | A1 | 5/2018 | Wang et al. |
| 2019/0033636 | A1* | 1/2019 | Morinaga ......... G02F 1/136286 |

FOREIGN PATENT DOCUMENTS

| | | |
|---|---|---|
| CN | 202013466 U | 10/2011 |
| CN | 202256970 U | 5/2012 |
| CN | 102902108 A | 1/2013 |
| CN | 203259749 U | 10/2013 |
| CN | 103439836 A | 12/2013 |
| CN | 106292080 A | 1/2017 |
| CN | 106707629 A | 5/2017 |
| JP | 08153586 A | 6/1996 |
| JP | 2002148636 A | 5/2002 |
| JP | 2004094117 A | 3/2004 |
| JP | 2012088578 A | 5/2012 |
| JP | 2013140190 A | 7/2013 |
| KR | 20060078524 A | 7/2006 |
| KR | 20140023223 A | 2/2014 |
| WO | 2015021716 A1 | 2/2015 |

OTHER PUBLICATIONS

English language translation of Chinese Patent Application No. 106707629; downloaded from the European Patent Office at https://worldwide.espacenet.com on Apr. 23, 2021. Translation provided by Google tool available onsite. (Year: 2017).*
Korean Office Action dated Nov. 6, 2019, 11 pages.
International Search Report and Written Opinion for corresponding PCT Application PCT/CN2017/115439.
Extended European Search Report dated Jan. 22, 2021 from EPO for European Patent Application No. 17889538.9, 9 pages.
Korean Office Action dated May 23, 2020, 8 pages.
Chinese Office Action dated Apr. 10, 2020, 11 pages.
Japanese Office Action dated Jun. 25, 2021.

* cited by examiner though a specific position or orientation relationship, which are only intended for the convenience of describing the present disclosure and simplifying the description, and are not intended to indicate or imply that the referenced apparatus or element must have a specific orientation or be constructed and operated in a specific orientation, therefore it cannot be understood as a limitation of the present disclosure.

SPACER, METHOD OF MANUFACTURING THE SAME, DISPLAY PANEL AND DISPLAY DEVICE

CROSS-REFERENCE TO RELATED APPLICATION

This application is a Section 371 National Stage Application of International Application No. PCT/CN2017/115439, filed on Dec. 11, 2017, entitled "SUBSTRATE, METHOD OF MANUFACTURING THE SAME, DISPLAY PANEL AND DISPLAY DEVICE", which has not yet been published and claims priority to Chinese Patent Application No. 201710395936.2, filed on May 27, 2017 in the State Intellectual Property Office of China, the disclosure of which is hereby incorporated by reference in its entirety.

BACKGROUND OF THE DISCLOSURE

Field of the Disclosure

The present disclosure relates to the field of display technologies, in particular, to a spacer, a method of manufacturing the spacer, a display panel, and a display device.

Description of the Related Art

An existing display panel is generally provided with spacers for supporting a cell thickness of the display panel. If the spacers are only made of a hard material, when the display panel is pressed, the hard spacers will cause two possible risks. One risk is that a substrate of the display panel is scratched due to no deformation of the spacers, and the other risk is that the spacers may be difficult to restore to their original shapes due to lack of elasticity after they are deformed, so that a poor display may be presented. If the spacers are only made of a material that has a low hardness, a supporting strength of the spacers may be slightly poor, and when the display panel is pressed, the spacers are likely to be displaced, so that a poor display may be presented.

SUMMARY

According to a first aspect of the present disclosure, it is provided a spacer including a first layer, a second layer and a third layer which are disposed in a stacked manner, wherein the second layer includes an upper portion and a lower portion, the lower portion is embedded in the first layer, at least a part of the upper portion is embedded in the third layer, and a hardness of a material of the second layer is higher than a hardness of a material of each of the first layer and the third layer.

Optionally, the second layer is of a flat plate type.

Optionally, both an upper surface area and a lower surface area of the lower portion are smaller than an area of a lower surface of the upper portion close to the lower portion.

Further optionally, the upper portion includes a flat-plate sub-portion and a raised sub-portion, the raised sub-portion being disposed at a side of the flat-plate sub-portion away from the lower portion; both an upper surface area and a lower surface area of the raised sub-portion are smaller than at least one of an upper surface area and a lower surface area of the flat-plate sub-portion; and at least the raised sub-portion of the upper portion is embedded in the third layer.

Further, both the flat-plate sub-portion and the raised sub-portion of the upper portion are embedded in the third layer.

In a case that both an upper surface area and a lower surface area of the raised sub-portion are smaller than at least one of an upper surface area and a lower surface area of the flat-plate sub-portion, optionally, the upper portion is of a flat plate type.

Further, side surfaces of the third layer cover side surfaces of the first layer, respectively.

Optionally, both the first layer and the third layer are resin layers.

Optionally, the second layer is a metal layer or a metal oxide layer.

Optionally, a maximum thickness of the second layer is within a range of 1000 to 4000 Å.

Optionally, at least one of the first layer and the third layer includes photoresist.

Optionally, a groove is formed in a surface of the first layer close to the second layer, and the lower portion of the second layer is embedded in the groove.

Optionally, one side surface of the second layer is exposed to a surface of the spacer or two opposite side surfaces of the second layer are respectively exposed to surfaces of the spacer.

According to a second aspect of the present disclosure, it is provided a display panel including a substrate and a spacer on the substrate, wherein the spacer is the spacer according to the first aspect.

Optionally, the display panel further includes a force touch structure, wherein the force touch structure includes a first electrode layer and a second electrode layer, and the first electrode layer and the second electrode layer are disposed at both sides of the spacer, respectively; and wherein the first electrode layer includes a plurality of first electrodes which are insulated from each other, and the second electrode layer includes a second planar electrode.

Further optionally, the display panel is an OLED display panel, and the second electrode is also used as a cathode of the OLED display panel.

Optionally, the display panel is a liquid crystal display panel, and the second electrode is also used as a common electrode of the liquid crystal display panel.

Further optionally, the display panel is a flexible display panel.

According to a third aspect of the present disclosure, it is provided a method of manufacturing a spacer including: forming a first layer, an upper surface of the first layer having a groove; forming a second layer, the second layer including an upper portion and a lower portion, and the lower portion being embedded in the groove of the first layer; and forming a third layer, at least a part of the upper portion being embedded in the third layer; wherein a hardness of a material of the second layer is higher than a hardness of a material of each of the first layer and the third layer.

According to a fourth aspect of the present disclosure, it is provided a display device including the display panel as described above.

BRIEF DESCRIPTION OF THE DRAWINGS

In order to more clearly describe the technical solutions in the embodiments of the present disclosure or the related art, the drawings used in the description of the embodiments or the related art will be briefly described below, and it is obvious that the drawings in the following description are only some embodiments of the present disclosure, and those skilled in the art can also obtain other drawings based on these drawings without any creative work.

DETAILED DESCRIPTION OF PREFERRED EMBODIMENTS OF THE DISCLOSURE

Figure 1:
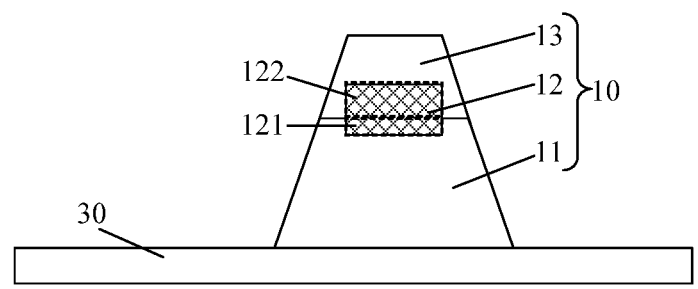
FIG. 1 is a schematic structural view of a spacer provided by at least one embodiment of the present disclosure.

The technical solutions in various embodiments of the present disclosure will be clearly and completely described below with reference to the accompanying drawings in various embodiments of the present disclosure. Apparently, the described embodiments are merely a part of the embodiments of the present disclosure, rather than all of the embodiments. All other embodiments, which are obtained by those skilled in the art based on various embodiments of the present disclosure without any creative effort, shall fall within the protection scope of the present disclosure.

At least one embodiment of the present disclosure provides a spacer 10, as shown in FIGS. 1-6, the spacer 10 is formed on a substrate 30. The spacer 10 includes a first layer 11, a second layer 12, and a third layer 13 disposed in a stacked manner. The second layer 12 includes a lower portion 121 which is embedded in the first layer 11, and an upper portion 122 which is at least partially embedded in the third layer 13. A hardness of a material of the second layer 12 is higher than a hardness of a material of each of the first layer 11 and the third layer 13.

In an embodiment, a shape of the spacer 10 may be a truncated prism, a prism, a truncated cone, or the like.

It should be noted that, for the convenience of description, in the present disclosure, the second layer 12 is divided into the upper portion 122 and the lower portion 121, but in essence, there may be no obvious interface on a contact surface between the upper portion 122 and the lower portion 121, that is, the second layer 12 may have one-piece structure.

In the embodiment, the words "upper" and "lower" in the upper portion 122 and the lower portion 121 refer to relative positions, in the present disclosure, a portion of the second layer 12 embedded in the first layer 11 is referred to as the lower portion 121, and the other portion of the second layer 12 is referred to as the upper portion 122.

The first layer 11, the second layer 12 and the third layer 13 are disposed in a stacked manner, that is, the first layer 11, the second layer 12 and the third layer 13 are stacked in a direction perpendicular to the substrate 30.

In the embodiment, the first layer 11 may be disposed near the substrate 30, and the third layer 13 may be disposed away from the substrate 30, that is, the first layer 11 is firstly formed, the second layer 12 is secondly formed, and then the third layer 13 is formed.

The material of the first layer 11 may be the same as or different from the material of the third layer 13. The material of the third layer 13 may be selected in such a way that the third layer 13 will not scratch a film layer or a glass substrate in contact with the spacer 10 when the substrate is applied to a display panel and the display panel is pressed.

In order to enable the lower portion 121 of the second layer 12 to be embedded in the first layer 11, a groove may be formed on a surface of the first layer 11 close to the second layer 12 when the first layer 11 is prepared, in this way, the lower portion 121 of the second layer 12 may be filled in the groove when the second layer 12 is formed, so that it is structurally embodied to be embedded in the first layer 11.

Based on the above description, according to the specific structure of the second layer 12, when the third layer 13 is formed on the second layer 12, it only needs to be structurally embodied that at least a part of the upper portion 122 of the second layer 12 is embedded in the third layer 13.

By taking the lower portion 121 embedded in the first layer 11 as an example, it is not limited to that the lower portion 121 is completely surrounded by the first layer 11, for example, it is possible that one side surface of the lower portion 121 is exposed to a surface of the spacer 10, or two opposite side surfaces of the lower portion 121 are exposed to surfaces of the spacer 10, respectively.

Similarly, with regard to the upper portion 122 embedded in the third layer 13, it is not limited to that the upper portion 122 is completely surrounded by the third layer 13, for example, it is possible that one side surface of the upper portion 122 is exposed to a surface of the spacer 10, or two opposite side surfaces of the upper portion 122 are exposed to surfaces of the spacer 10, respectively.

At least one embodiment of the present disclosure provides a spacer. The spacer 10 may include the first layer 11, the second layer 12 and the third layer 13 disposed in a stacked manner, and the hardness of the second layer 12 is higher than that of each of the first layer 11 and the third layer 13, in this way, at least the supporting strength of the spacer 10 may be significantly improved while a low hardness of the surface of the spacer 10 is ensured. Further, a thickness of the second layer 12 may be reasonably set to ensure an elasticity of the spacer 10, thereby at least avoiding the problem that the spacer 10 cannot be restored to the original shape after the pressure on the display panel is removed. Moreover, the lower portion 121 of the second layer 12 is embedded in the first layer 11 and at least a part of the upper portion 122 of the second layer 12 is embedded in the third layer 13, so as to prevent the first layer 11 of low hardness and the third layer 13 of low hardness from being displaced when the substrate provided with the spacer 10 is applied to the display panel and the display panel is pressed, so that at least a displacement of the spacer 10 may be avoided.

Figure 2:
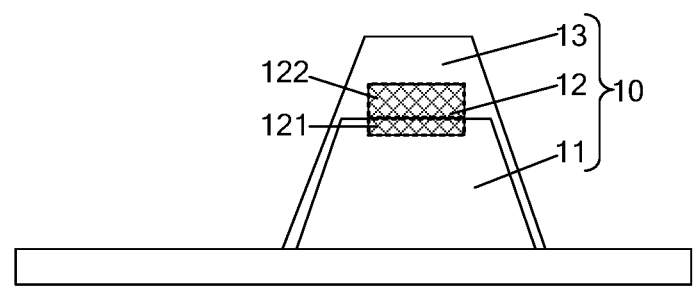
FIG. 2 is a schematic structural view of a spacer provided by at least one embodiment of the present disclosure.

Optionally, as shown in FIG. 1 and FIG. 2, the second layer 12 is of a flat plate type, that is, a cross section of the second layer 12 in the direction perpendicular to the substrate is rectangular.

In this case, a sum of the thicknesses of the lower portion 121 of the second layer 12 and the thickness of the upper portion 122 of the second layer 12 is equal to the thickness of the second layer 12.

When the second layer 12 is of a flat plate type, the second layer 12 may be formed simply by using an ordinary mask. Therefore, the process is relatively simple and the cost is low.

Optionally, as shown in FIGS. 3-6, both an upper surface area and a lower surface area of the lower portion 121 are smaller than an area of a lower surface of the upper portion 122 close to the lower portion 121. In other words, the lower portion 121 is a small protrusion provided on the upper portion 122.

In an optional embodiment, the lower portion 121 may be embedded in a middle position at a side of the first layer 11 close to the second layer 12. In this case, the lower portion 121 is completely surrounded by the first layer 11.

In at least one embodiment of the present disclosure, both the upper surface area and the lower surface area of the lower portion 121 are made smaller, thereby avoiding a thick lower portion 121 from affecting greatly the elasticity of the spacer 10. In this way, the thickness of the lower portion 121 may be made large, so that the first layer 11 having a lower hardness is prevented from being displaced when the substrate is applied to the display panel and the display panel is pressed.

Figure 3:
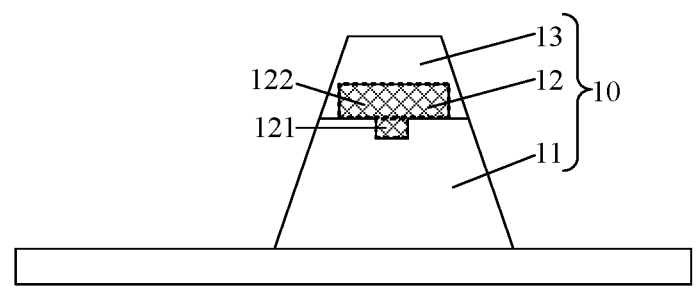
FIG. 3 is a schematic structural view of a spacer provided by at least one embodiment of the present disclosure.
Figure 4:
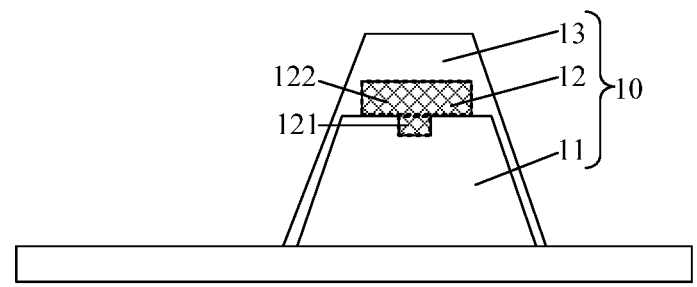
FIG. 4 is a schematic structural view of a spacer provided by at least one embodiment of the present disclosure.

Further optionally, as shown in FIG. 3 and FIG. 4, the upper portion 122 is of a flat plate type, that is, a cross section of the upper portion 122 in the direction perpendicular to the substrate is rectangular.

Figure 5:
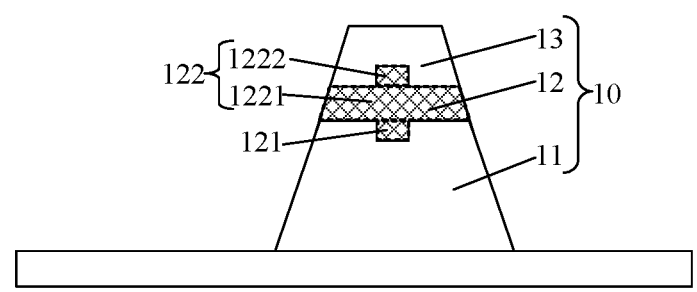
FIG. 5 is a schematic structural view of a spacer provided by at least one embodiment of the present disclosure.
Figure 6:
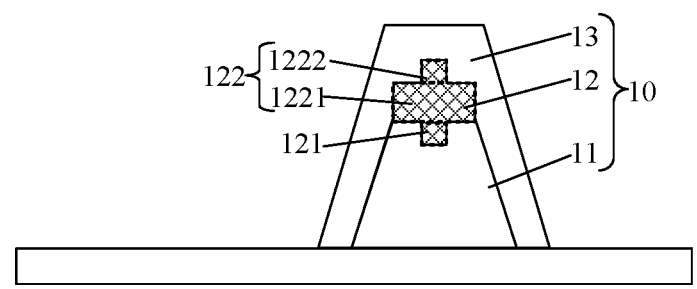
FIG. 6 is a schematic structural view of a spacer provided by at least one embodiment of the present disclosure.

Alternatively, optionally, as shown in FIG. 5 and FIG. 6, the upper portion 122 includes a flat-plate sub-portion 1221 and a raised sub-portion 1222 which is disposed on a side of the flat-plate sub-portion 1221 away from the lower portion 121. Both an upper surface area and a lower surface area of the raised sub-portion 1222 is less than an upper surface area or a lower surface area of the flat-plate sub-portion 1221. At least the raised sub-portion 1222 is embedded in the third layer 13. As shown in FIG. 5 and FIG. 6, the second layer 12 includes the lower portion 121, the flat-plate sub-portion 1221, and the raised sub-portion 1222. Thus, a cross section of the second layer 12 in the direction perpendicular to the substrate is in a cross shape.

In an embodiment, when only the raised sub-portion 1222 is embedded in the third layer 13, as shown in FIG. 5, side surfaces of the flat-plate sub-portion 1221 are exposed to the surfaces of the spacer 10, respectively. Optionally, the raised sub-portion 1222 is embedded in a middle position at a side of the third layer 13 close to the second layer 12. In this case, the raised sub-portion 1222 is completely surrounded by the third layer 13.

When only the raised sub-portion 1222 of the upper portion 122 is embedded in the third layer 13, both the upper surface area and the lower surface area of the raised sub-portion 1222 are made smaller, thereby avoiding a thick raised sub-portion 1222 from affecting greatly the elasticity of the spacer 10. In this way, the thickness of the raised sub-portion 1222 may be made large, so that the third layer 13 having a lower hardness is prevented from being displaced when the substrate is applied to the display panel and the display panel is pressed.

In the case where the upper portion 122 includes the flat-plate sub-portion 1221 and the raised sub-portion 1222, as shown in FIG. 6, optionally, the flat-plate sub-portion 1221 and the raised sub-portion 1222 are both embedded in the third layer 13, that is, the upper portion 122 is entirely embedded in the third layer 13. In this way, the third layer 13 having a lower hardness is further prevented from being displaced when the substrate is applied to the display panel and the display panel is pressed.

Based on the above description, optionally, as shown in FIG. 2, FIG. 4 and FIG. 6, side surfaces of the third layer 13 may cover side surfaces of the first layer 11, respectively. In other words, the third layer 13 may enclose the first layer 11 and the second layer 12.

It should be noted that, when only the raised sub-portion 1222 is embedded in the third layer 13, the side surfaces of the flat-plate sub-portion 1221 are exposed to the surfaces of the spacer 10 (as shown in FIG. 5), and therefore in this case, the side surfaces of the third layer 13 may not cover the side surfaces of the first layer 11.

In at least one embodiment of the present disclosure, the third layer 13 encloses the first layer 11 and the second layer 12 so that both the first layer 11 having a lower hardness and the third layer 13 having a lower hardness are further prevented from being displaced.

Based on the above description, optionally, the first layer 11 and the third layer 13 may be resin layers. In an embodiment, the material of the resin layers may include epoxy resin, acrylic resin and the like.

The material of the first layer 11 may be the same as the material of the third layer 13. Alternatively, the material of the first layer 11 may be different from the material of the third layer 13.

Further optionally, at least one of the first layer 11 and the third layer 13 may include photoresist.

Due to the low hardness of the resin material, by setting the first layer 11 and the third layer 13 as the resin layers, the spacer 10 may have good elasticity, and both the first layer 11 and the third layer 13 will not scratch a film layer or a glass substrate in contact with the spacer 10 when the substrate is applied to a display panel and the display panel is pressed. In addition, when the photoresist is used as the material of the first layer 11 and/or the third layer 13, the processes of forming the first layer 11 and/or the third layer 13 may also be simplified.

Optionally, the second layer 12 may be a metal layer or a metal oxide layer.

In an embodiment, the material of the metal layer may include elementary metals, metal alloys and the like. For example, the material of the metal layer may include Mo (molybdenum), Al (aluminum), molybdenum aluminum alloy, and the like.

The material of the metal oxide layer may include metal oxides such as ITO (Indium Tin Oxide), IZO (Indium Zinc Oxide), and the like.

Since the hardness of the metal material and the hardness of the metal oxide material are high, the supporting strength of the spacer 10 may be ensured by setting the second layer 12 as the metal layer or the metal oxide layer.

Optionally, a maximum thickness of the second layer 12 is within a range of 1000 to 4000 Å. In this way, the supporting strength of the spacer 10 may be ensured without producing great influence on the elasticity of the spacer 10.

At least one embodiment of the present disclosure also provides a display panel including a substrate, and a spacer on the substrate. In an embodiment, the spacer may be any one of the above-mentioned spacers.

In an embodiment, the display panel may be a liquid crystal display panel. In this case, the substrate may be an array substrate, and may also be an opposite substrate opposite to the array substrate.

Alternatively, the display panel may be an OLED (Organic Light Emitting Diode) display panel. In this case, the substrate is an array substrate. Further, the OLED display panel may further include a packaging film or a packaging substrate. In an embodiment, the packaging film or the packaging substrate is in contact with the spacer 10.

At least one embodiment of the present disclosure provides a display panel including the spacer 10. The spacer 10 may include the first layer 11, the second layer 12 and the third layer 13 disposed in a stacked manner, and the hardness of the second layer 12 is higher than that of each of the first layer 11 and the third layer 13, in this way, at least the supporting strength of the spacer 10 may be significantly improved while a low hardness of the surface of the spacer 10 is ensured. Further, a thickness of the second layer 12 may be reasonably set to ensure an elasticity of the spacer 10, thereby at least avoiding the problem that the spacer 10 cannot be restored to the original shape after the pressure on the display panel is removed. Moreover, the lower portion 121 of the second layer 12 is embedded in the first layer 11 and at least a part of the upper portion 122 of the second layer 12 is embedded in the third layer 13, so as to prevent the first layer 11 of low hardness and the third layer 13 of low hardness from being displaced when the display panel is pressed, so that at least a displacement of the spacer 10 may be avoided. Therefore, a deformation effect after the display panel is pressed may be improved, and the problem of poor display due to the spacer 10 after the display panel is pressed may be alleviated or eliminated.

Figure 7:
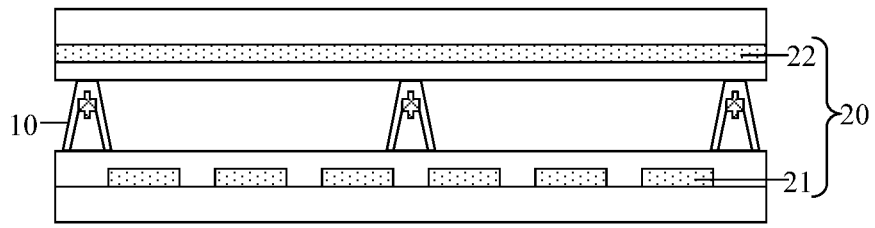
FIG. 7 is a schematic structural view of a display panel provided by at least one embodiment of the present disclosure.

Optionally, as shown in FIG. 7, the display panel further includes a force touch structure 20. The force touch structure 20 includes a first electrode layer and a second electrode layer. The first electrode layer and the second electrode layer are disposed at two sides of the spacer 10, respectively. In an embodiment, the first electrode layer may include a plurality of first electrodes 21 which are insulated from each other. The second electrode layer may include a second planar electrode 22.

In a case, the plurality of first electrodes 21 may be arranged, for example, in an array.

In this case, according to the parallel plate capacitance formula, i.e. C∝εS/d, it can be understood that a capacitance (C) is generated between the first electrode 21 and the second electrode 22. Based on the formula, when the display panel is not pressed, the capacitance generated between the first electrode layer and the second electrode layer is kept constant. When the display panel is pressed, the display panel is deformed as the spacer 10 is pressed, and a distance between the first electrode 21 at a pressed position and the second electrode 22 is changed, so that the capacitance generated between the first electrode 21 and the second electrode 22 is changed, and thus a pressure value may be obtained by means of corresponding conversion.

Based on the above description, the pressure value may be compared with pre-stored standard pressure ranges. If the pressure value is within one of the standard pressure ranges, a function corresponding to the one of the standard pressure ranges is performed, for example, enlarging the information at the touch position, returning to homepage, locking screen, etc.

In an embodiment, one standard pressure range may correspond to one function of the display device. Therefore, a plurality of standard pressure ranges may be set according to specific function items, and the corresponding relationship therebetween may be set in advance.

In at least one embodiment of the present disclosure, the force touch structure 20 is disposed on the display panel, and the first electrode layer 21 and the second electrode layer 22 of the force touch structure 20 are respectively disposed on two sides of the spacer 10, so that the force touch structure may recognize the pressure value based on the deformation of the spacer 10 when the display panel is pressed, thereby improving the user experience. In addition, due to the special design of the spacer 10, the deformation effect of the display panel after being pressed may be improved, thereby increasing the pressure recognition accuracy.

Further optionally, in the case that the display panel is an OLED display panel, the second electrode may be also used as a cathode.

In the case that the display panel is a liquid crystal display panel, the second electrode may be also used as a common electrode.

In this way, the process of preparing the display panel may be simplified.

In an optional embodiment, the display panel may be a flexible display panel.

Since the flexible display panel is often bent, the display panel is often deformed. Therefore, the aforementioned design of the spacer 10 is applied to the flexible display panel to improve the performances of the flexible display panel.

Figure 8:
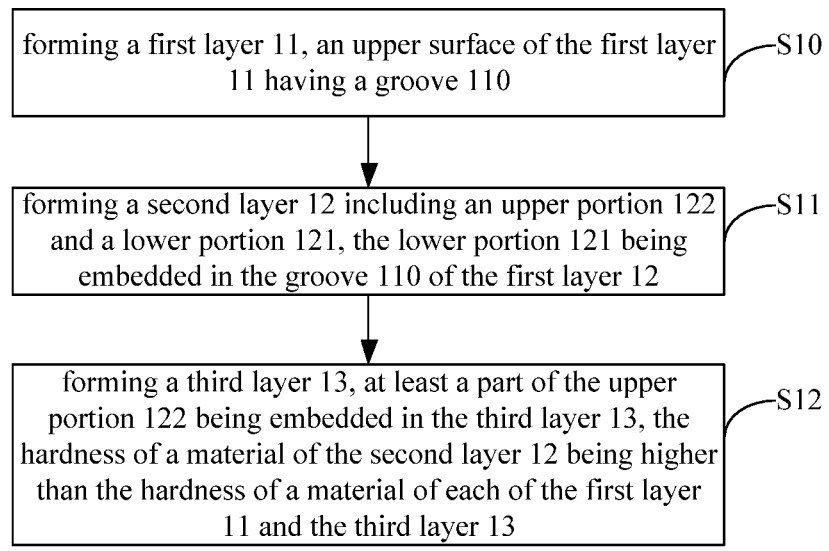
FIG. 8 is a schematic flow chart of manufacturing a spacer according to at least one embodiment of the present disclosure.

At least one embodiment of the present disclosure also provides a method of manufacturing a spacer. as shown in FIG. 8, the method of manufacturing a spacer 10 may include:

S10, forming a first layer 11, an upper surface of the first layer 11 having a groove 110.

Figure 9A:
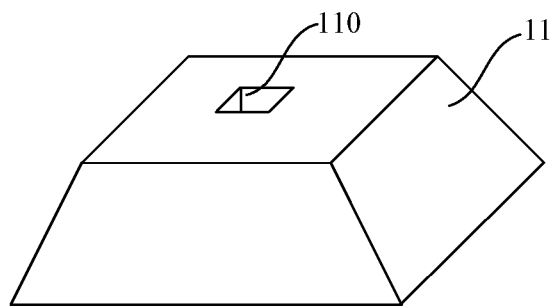
FIG. 9A is a schematic view of a first layer in a spacer provided by at least one embodiment of the present disclosure.
Figure 9B:
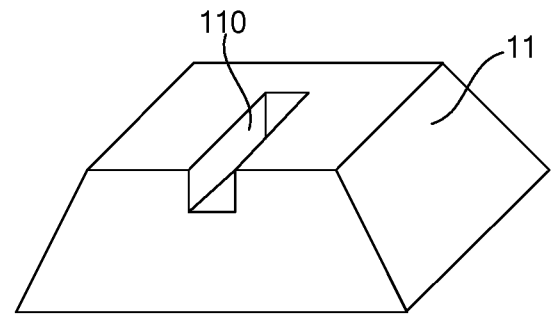
FIG. 9B is a schematic view of a first layer in a spacer provided by at least one embodiment of the present disclosure.

For example, the shape of the first layer 11 may be a truncated quadrangular prism. The groove 110 may be disposed at a middle position of an upper surface of the first layer 11 as shown in FIG. 9A. Alternatively, as shown in FIG. 9B, the groove 110 may penetrate through a side surface of the first layer 11. Alternatively, as shown in FIG. 9C, two side surfaces of the groove 110 are exposed to outer surfaces of the first layer 11, respectively.

In an embodiment, the first layer 11 may be formed by processes such as film formation, exposure, development, etching and the like.

The step of forming a spacer 10 may further include: S11, forming a second layer 12. The second layer 12 includes an upper portion 122 and a lower portion 121. The lower portion 121 is embedded in the groove 110 of the first layer 12.

Figure 9C:
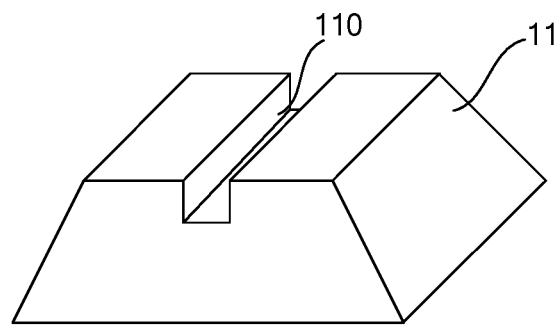
FIG. 9C is a schematic view of a first layer in a spacer provided by at least one embodiment of the present disclosure.
Figure 10A:
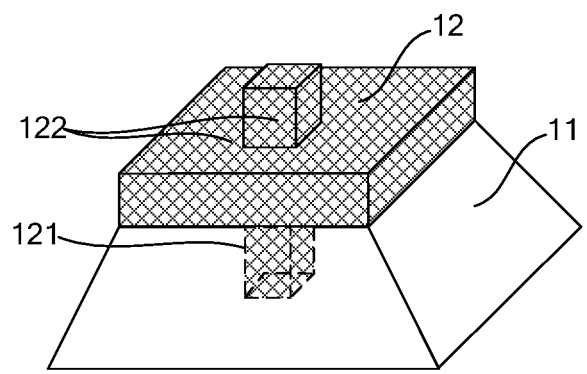
FIG. 10A is a schematic view of a second layer in a spacer provided by at least one embodiment of the present disclosure.
Figure 10B:
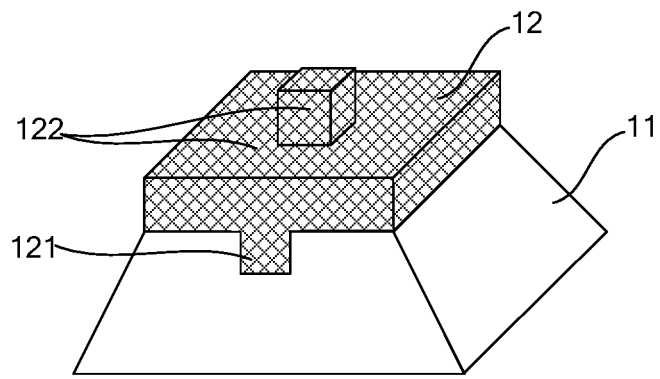
FIG. 10B is a schematic view of a second layer in a spacer provided by at least one embodiment of the present disclosure.

For example, corresponding to FIG. 9A, the second layer 12 as shown in FIG. 10A may be formed; corresponding to FIGS. 9B and 9C, the second layer 12 as shown in FIG. 10B may be formed.

In an embodiment, the second layer 12 may be formed by processes such as film formation, exposure, development, etching and the like.

The step of forming a spacer 10 may further include: S12, forming a third layer 13. At least a part of the upper portion 122 is embedded in the third layer 13. In the embodiment, the hardness of a material of the second layer 12 is higher than the hardness of a material of each of the first layer 11 and the third layer 13.

Figure 11A:
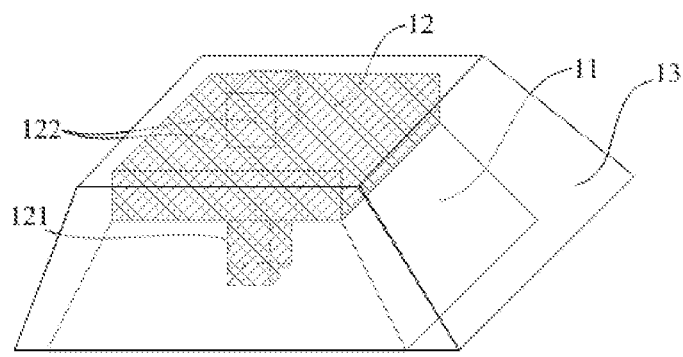
FIG. 11A is a schematic view of a third layer in a spacer provided by at least one embodiment of the present disclosure.
Figure 11B:
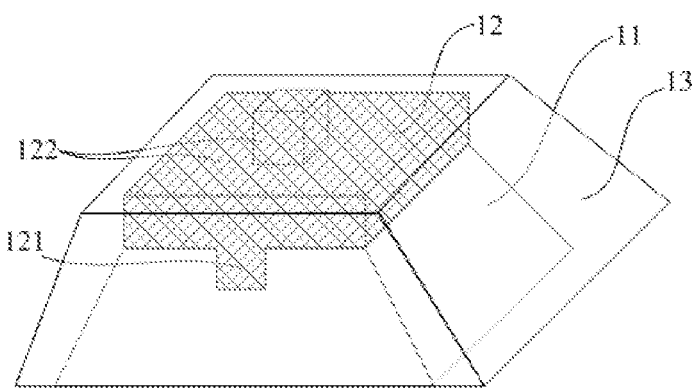
FIG. 11B is a schematic view of a third layer in a spacer provided by at least one embodiment of the present disclosure.

For example, the shape of the third layer 13 may be a truncated quadrangular prism. Corresponding to FIG. 10A, the third layer 13 as shown in FIG. 11A may be formed; corresponding to FIG. 10B, the third layer 13 as shown in FIG. 11B may be formed.

In an embodiment, the third layer 13 may be formed by processes such as film formation, exposure, development, etching and the like.

At least one embodiment of the present disclosure provides a method of manufacturing the spacer 10. The spacer 10 may include the first layer 11, the second layer 12 and the third layer 13 disposed in a stacked manner, and the hardness of the second layer 12 is higher than that of each of the first layer 11 and the third layer 13, in this way, at least the supporting strength of the spacer 10 may be significantly improved while a low hardness of the surface of the spacer 10 is ensured. Further, a thickness of the second layer 12 may be reasonably set to ensure an elasticity of the spacer 10, thereby at least avoiding the problem that the spacer 10 cannot be restored to the original shape after the pressure on the display panel is removed. Moreover, the lower portion 121 of the second layer 12 is embedded in the first layer 11 and at least a part of the upper portion 122 of the second layer 12 is embedded in the third layer 13, so as to prevent the first layer 11 of low hardness and the third layer 13 of low hardness from being displaced when the substrate provided with the spacer is applied to a display panel and the display panel is pressed, so that at least a displacement of the spacer 10 may be avoided.

At least one embodiment of the present disclosure provides a display device including the above display panel. The display device may be any product or component having a display function, such as a liquid crystal panel, an electronic paper, an OLED panel, a mobile phone, a tablet computer, a television, a display, a notebook computer, a digital photo frame, a navigator, and the like.

The foregoing descriptions are merely specific implementation manners of the present disclosure, but the protection scope of the present disclosure is not limited thereto, and those skilled in the art can easily think of changes or substitutes within the technical scope disclosed by the present disclosure. These changes and substitutes should be within the scope of the disclosure. Therefore, the protection scope of the present disclosure should be defined by the protection scope of the claims.

What is claimed is:

1. A spacer comprising: a first layer; a second layer; and a third layer which are disposed in a stacked manner; wherein the second layer comprises an upper portion and a lower portion; and wherein the lower portion is embedded in the first layer; and wherein at least a part of the upper portion is embedded in the third layer; wherein a hardness of a material of the second layer is higher than a hardness of a material of each of the first layer and the third layer; and wherein the upper portion comprises a flat-plate sub-portion and a raised sub-portion, the raised sub-portion being disposed at a side of the flat-plate sub-portion away from the lower portion, wherein both an upper surface area and a lower surface area of the raised sub-portion are smaller than at least one of an upper surface area and a lower surface area of the flat-plate sub-portion, and wherein at least the raised sub-portion of the upper portion is embedded in the third layer.

2. The spacer according to claim 1, wherein both an upper surface area and a lower surface area of the lower portion are smaller than an area of a lower surface of the upper portion close to the lower portion.

3. The spacer according to claim 1, wherein both the flat-plate sub-portion and the raised sub-portion of the upper portion are embedded in the third layer.

4. The spacer according to claim 1, wherein side surfaces of the third layer cover side surfaces of the first layer, respectively.

5. The spacer according to claim 1, wherein both the first layer and the third layer are resin layers.

6. The spacer according to claim 1, wherein the second layer is a metal layer or a metal oxide layer.

7. The spacer according to claim 1, wherein a maximum thickness of the second layer is within a range of 1000 to 4000 Å.

8. The spacer according to claim 1, wherein at least one of the first layer and the third layer comprises photoresist.

9. The spacer according to claim 1, wherein a groove is formed in a surface of the first layer close to the second layer, and the lower portion of the second layer is embedded in the groove.

10. The spacer according to claim 1, wherein one side surface of the second layer is exposed to a surface of the spacer or two opposite side surfaces of the second layer are respectively exposed to surfaces of the spacer.

11. A display panel comprising:
a substrate, and
the spacer according to claim 1 on the substrate.

12. The display panel according to claim 11, further comprising a force touch structure,
wherein the force touch structure comprises a first electrode layer and a second electrode layer, and the first electrode layer and the second electrode layer are disposed at both sides of the spacer, respectively; and
wherein the first electrode layer comprises a plurality of first electrodes which are insulated from each other, and the second electrode layer comprises a second planar electrode.

13. The display panel according to claim 12, wherein the display panel is an OLED display panel, and the second electrode is also used as a cathode of the OLED display panel.

14. The display panel according to claim 12, wherein the display panel is a liquid crystal display panel, and the second electrode is also used as a common electrode of the liquid crystal display panel.

15. The display panel according to claim 11, wherein the display panel is a flexible display panel.

16. A display device comprising the display panel according to claim 11.

17. A method of manufacturing a spacer, the method comprising:
forming a first layer, an upper surface of the first layer having a groove;
forming a second layer, the second layer comprising an upper portion and a lower portion, and the lower portion being embedded in the groove of the first layer; and
forming a third layer, at least a part of the upper portion being embedded in the third layer;
wherein a hardness of a material of the second layer is higher than a hardness of a material of each of the first layer and the third layer; and
wherein the upper portion comprises a flat-plate sub-portion and a raised sub-portion, the raised sub-portion being disposed at a side of the flat-plate sub-portion away from the lower portion, wherein both an upper surface area and a lower surface area of the raised sub-portion are smaller than at least one of an upper surface area and a lower surface area of the flat-plate sub-portion, and wherein at least the raised sub-portion of the upper portion is embedded in the third layer.

* * * * *